(12) United States Patent
Chang et al.

(10) Patent No.: US 6,648,679 B2
(45) Date of Patent: Nov. 18, 2003

(54) METHOD AND APPARATUS FOR OPTICAL COMPONENT MOUNTING

(75) Inventors: Shu-Ching Chang, Ping Tung (TW); Ho-Tai Liu, Banchiau (TW); Daniel Forrest McMiller, Cardiff by the Sea, CA (US)

(73) Assignee: General Instrument Corporation, Horsham, PA (US)

( * ) Notice: Subject to any disclaimer, the term of this patent is extended or adjusted under 35 U.S.C. 154(b) by 0 days.

(21) Appl. No.: 10/093,748

(22) Filed: Mar. 7, 2002

(65) Prior Publication Data

US 2003/0171028 A1 Sep. 11, 2003

(51) Int. Cl.⁷ .............................................. H01R 13/60
(52) U.S. Cl. .................................................. 439/540.1
(58) Field of Search .............................. 439/540.1, 541, 439/79, 80, 490

(56) References Cited

U.S. PATENT DOCUMENTS

| | | | |
|---|---|---|---|
| 4,674,008 A | * | 6/1987 | Oyama et al. ............... 361/681 |
| 4,753,609 A | * | 6/1988 | Pfeffer et al. ................ 439/541 |
| 5,704,802 A | * | 1/1998 | Loudermilk ................ 439/490 |
| 6,257,736 B1 | * | 7/2001 | Fehrenbach ................. 362/226 |

FOREIGN PATENT DOCUMENTS

| | | | |
|---|---|---|---|
| DE | 27 14 168 | * | 10/1978 |
| DE | 27 18 442 | * | 11/1978 |
| DE | 27 47 272 | * | 4/1979 |

* cited by examiner

Primary Examiner—Tulsidas Patel
(74) Attorney, Agent, or Firm—Fitch, Even, Tabin & Flannery

(57) ABSTRACT

The present invention provides a method and apparatus for mounting a plurality of components, preferably optical components, with a device, such as a circuit board, to provide communication onto and off of the device. The apparatus includes a mount body having an interface wall, a first component mount fixed with the interface wall, wherein the first component mount extends out from the interface wall, and a second component mount fixed with the interface wall, wherein the second component mount extends out from the interface wall. The first component mount is configured to receive and secure a first optical component such that at least a portion of the first optical component extends out from the interface wall. The second component mount is configured to receive and secure a second optical component such that at least a portion of the second optical component extends out from the interface wall.

20 Claims, 3 Drawing Sheets

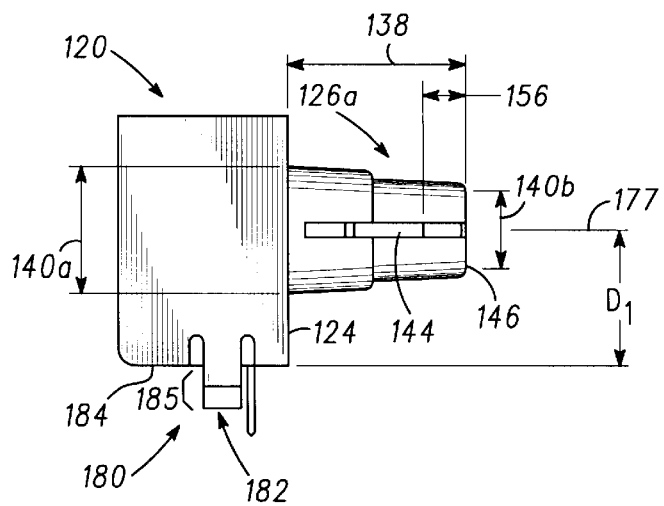
FIG. 3
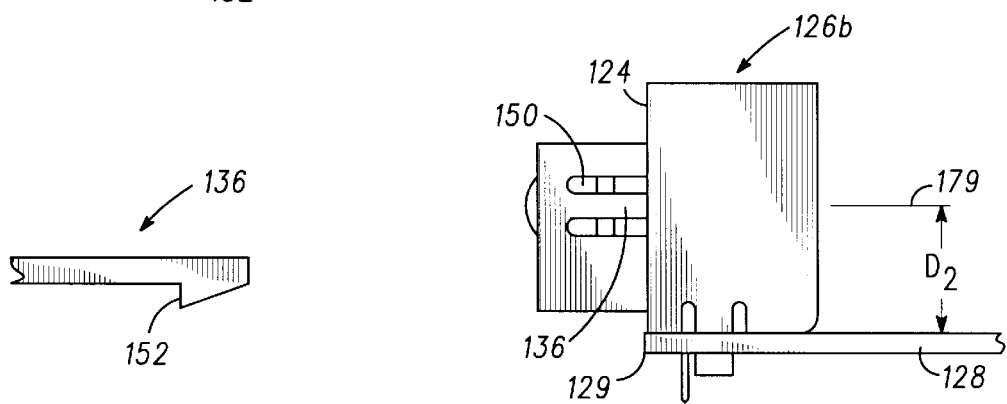
FIG. 5
FIG. 4
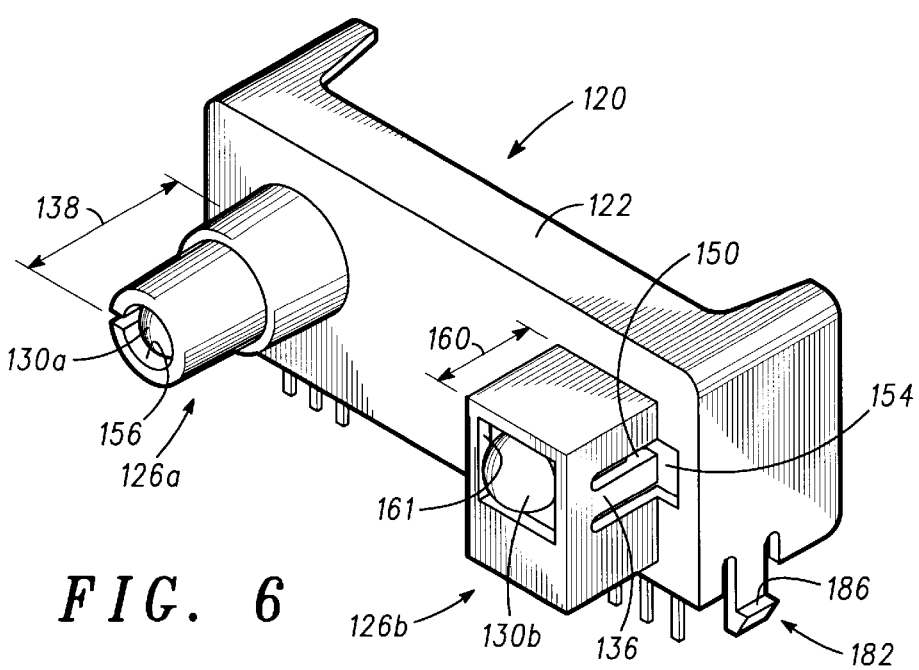
FIG. 6

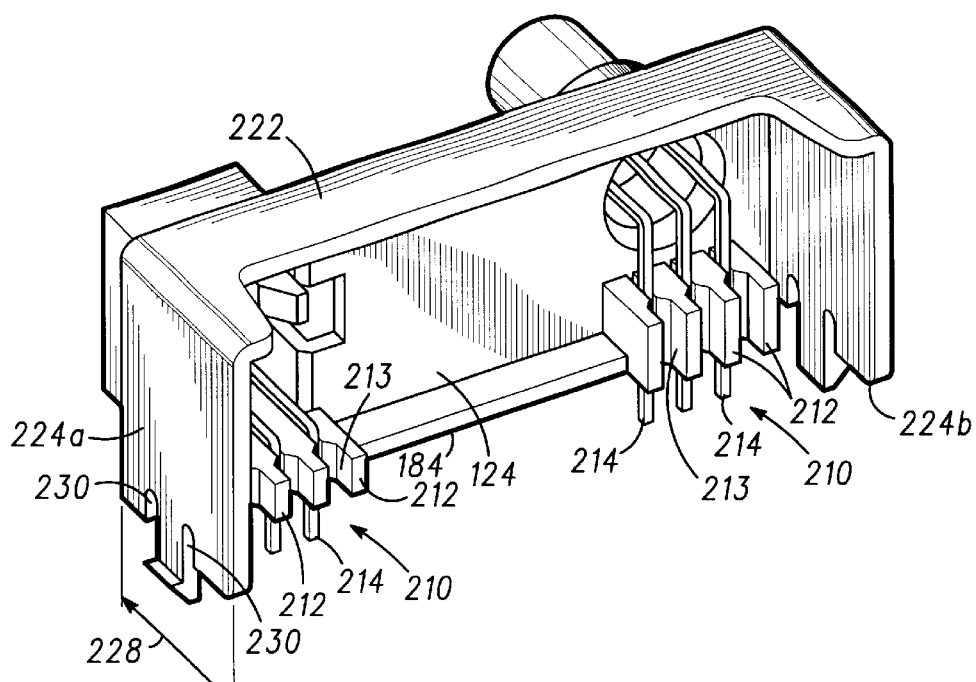
FIG. 7
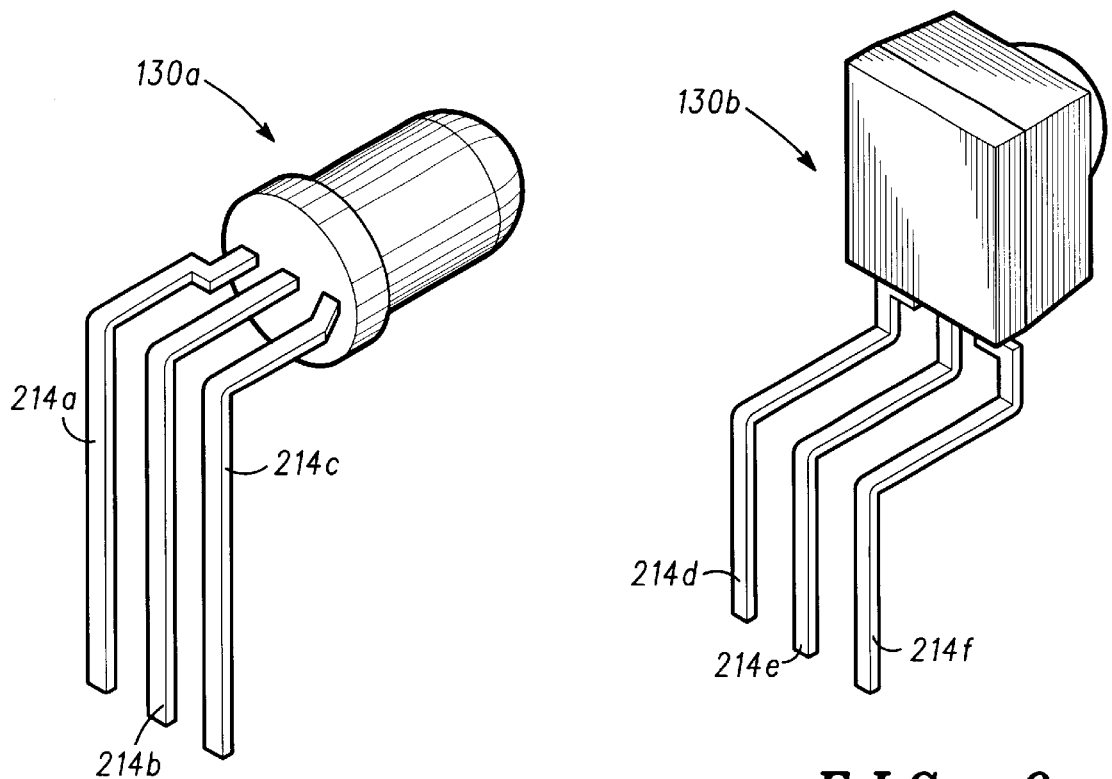
FIG. 8
FIG. 9

US 6,648,679 B2

METHOD AND APPARATUS FOR OPTICAL COMPONENT MOUNTING

BACKGROUND

1. Field of the Invention

The present invention relates generally to electromechanical packaging, and more specifically to mounting of components onto a circuit.

2. Discussion of the Related Art

Many electronic circuits utilize optical signals to communicate information, signals and/or data on and off the circuit including, personal computer (PC) circuit boards, calculator circuit board, personal digital assistant (PDA) circuit boards and other circuit boards. Often these circuits need to be able to transmit and receive light from a chassis mounted circuit board to and through a housing or panel, for example through a front panel of a computer.

One of the significant problems with establishing the optical communication onto and off of the circuit is the mounting of the optical components. Previous systems mount the optical components onto the circuit board. However, once mounted onto the circuit board, the optical components require additional optical coupling to transmit optical signals off of and receive optical signals onto the circuit board. Previous systems have used light pipes to bring the light off of and onto the circuit and, for example, to the front of the front panel, or have used a second front panel mounted circuit board with mounted components. This adds additional costs for circuitry, adds additional design costs (man power) for designing, adds additional part costs (piece cost), adds additional general manufacturing costs, adds additional cost for assembly and adds additional cost to ensure accurate alignment of the optical components with the light pipes and/or second, auxiliary circuit board.

It is with respect to these and other background information factors of mounting component that the present invention has evolved.

SUMMARY OF THE INVENTION

The present invention advantageously addresses the needs above as well as other needs through a method and apparatus for optimally mounting components with devices, such as circuit boards. The apparatus includes: a mount body having an interface wall; a first component mount fixed with the interface wall, wherein the first component mount extends out from the interface wall; the first component mount being configured to receive and secure a first optical component such that at least a portion of the first optical component extends out from the interface wall; a second component mount fixed with the interface wall, wherein the second component mount extends out from the interface wall; and the second component mount being configured to receive and secure a second optical component such that at least a portion of the second optical component extends out from the interface wall.

In another embodiment, the invention can be characterized as an apparatus for mounting a plurality of optical components to a circuit board to provide optical communication to and from a circuit board. The apparatus includes a first means for mounting a component configured to receive a first component; the first means for mounting the first component includes a first means for securing the first component, wherein the first means for securing the first component being configured to secure the first component with the first means for mounting; a second means for mounting a component configured to receive a second component; the second means for mounting the second component includes a second means for securing the second component, wherein the second means for securing the second component being configured to secure the second component with the second means for mounting; and the first means for mounting the first component and the second means for mounting the second component both being fixed with a mount body such that the first and second means for mounting the first and second components extend out from the mount body such that at least a portion of the first and second components extend out from the mount body.

The present invention provides a method of mounting components. The method includes the steps of: securing a first optical component within a first component mount; securing a second optical component within a second component mount; fixing the first and second component mounts in positions relative with each other; securing the first and second component mounts with a circuit board and positioning the first and second optical components at a predefined distance above the circuit board.

A better understanding of the features and advantages of the present invention will be obtained by reference to the following detailed description of the invention and accompanying drawings which set forth an illustrative embodiment in which the principles of the invention are utilized.

BRIEF DESCRIPTION OF THE DRAWINGS

The above and other aspects, features and advantages of the present invention will be more apparent from the following more particular description thereof, presented in conjunction with the following drawings wherein:

FIG. 3 depicts a left side view of the mounting apparatus shown in FIG. 1;

FIG. 4 depicts a right side view of the mounting apparatus shown in FIG. 1;

FIG. 5 shows a side view of a fastener according to one embodiment of the present invention;

FIG. 6 shows the apparatus as shown in FIG. 1 with a first component and a second component mounted and secured within the first and second component mounts, respectively;

FIG. 7 shows an elevated backside view of a schematic diagram of the mounting apparatus;

FIG. 8 depicts a first optical component and leads; and

FIG. 9 shows a second optical component and leads.

Corresponding reference characters indicate corresponding components throughout the several views of the drawings.

DETAILED DESCRIPTION

The following description is not to be taken in a limiting sense, but is made merely for the purpose of describing the general principles of the invention. The scope of the invention should be determined with reference to the claims.

The present invention provides an apparatus and method for mounting to improve and simplify the mounting of circuit component, for example, mounting optical components onto a device such as a circuit board. Further, the mounting apparatus optimizes alignment of optical components by ensuring that the optical components are precisely positioned on the circuit board and that the optical components are precisely maintained at a predefined height from the circuit board. This allows easier alignment with other optical components to be communicated with off the circuit board. The stability and fixed positioning of the optical components provided by the mounting apparatus enhances the optical communication to and from the optical components and thus the communication onto and off of the circuit board.

Mounting apparatus in accordance with the present invention mount both transmit and receive optical components together, moving the optical components forward, off and over the boundary of the circuit board at predefined correct heights and distances for optimal alignment with other optical components. Further, because the optical components are securely mounted within the mounting apparatus the optical components are further protected from damage during handling, shipping and assembly. Additionally, the mounting apparatus aids in directing and channeling light from and to the optical components. Further, the mounting apparatus protects the optical components from stray light that may cause interference, for example, protecting sensors from stray light to avoid dysfunctional operation. Additionally, the present invention mounts a plurality of components through the single apparatus thus reducing and/or eliminating material handling costs and extra tooling costs.

Figure 1:
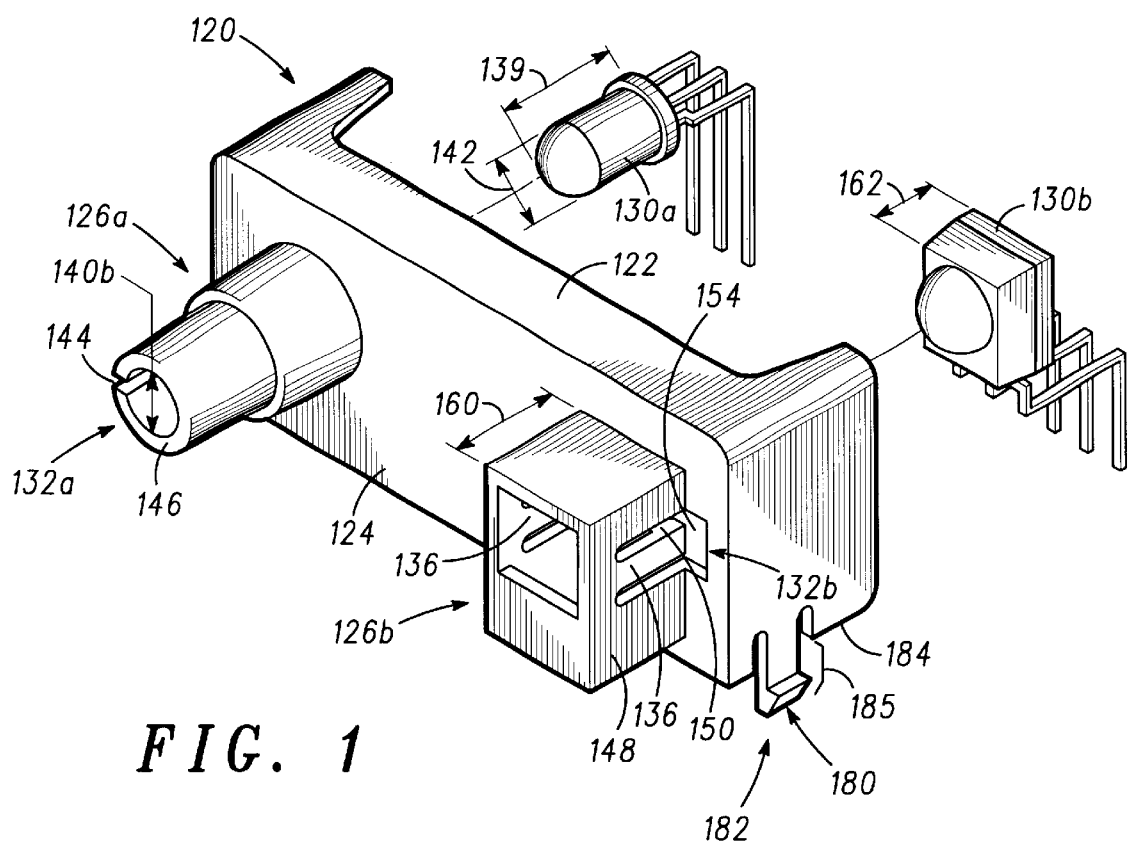
FIG. 1 depicts a schematic diagram of the present mounting apparatus according to one embodiment of the present invention.
Figure 2:
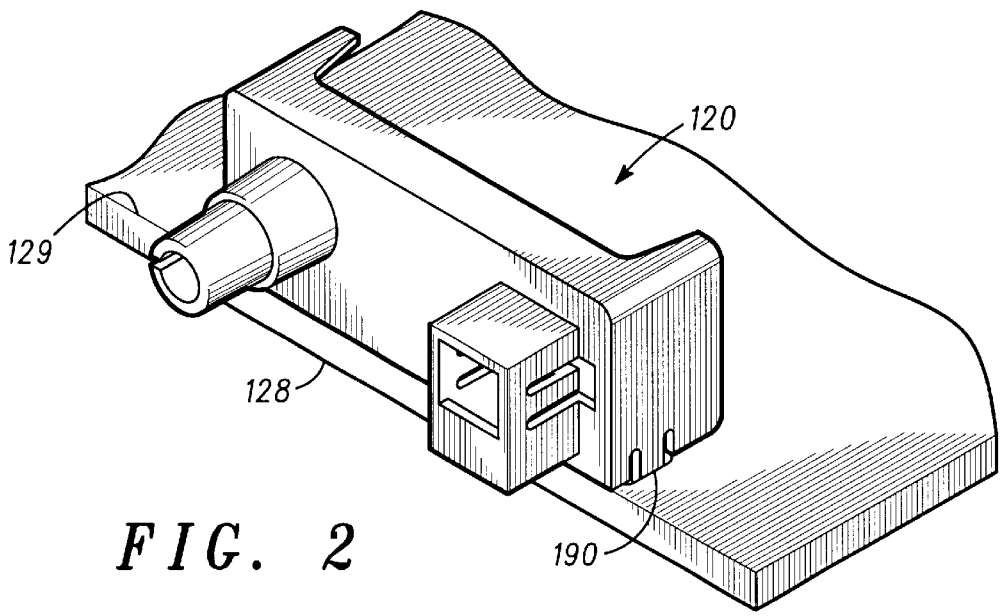
FIG. 2 depicts a schematic diagram of the present mounting apparatus mounted with a device.

FIG. 1 depicts a schematic diagram of the present mounting apparatus 120 according to one embodiment of the present invention providing mounting of components 130a–b with a device 128, such as a circuit board. FIG. 2 depicts a schematic diagram of the present mounting apparatus 120 mounted with a device 128. The mounting method and apparatus 120 can be configured to mount components to substantially any circuit board or device including, but not limited to, satellite receiver circuit boards, router circuit boards, transceiver circuit boards, personal computer (PC) circuit boards, calculator circuit board, personal digital assistant (PDA) circuit boards and other circuit boards. For example, the mounting apparatus can be configured to mount optical components to allow optical communication to and from a chassis mounted circuit board to and through a front panel of a designed satellite receiver. As another example, the mounting apparatus provides a fixture device that mounts to a PC board to hold, locate and protect a plurality of components, such as an infrared receiver (IR) sensor and a light emitting diode (LED,) together into one unit.

The mounting apparatus 120 includes a mount body 122 that provides a general overall structure to the apparatus 120. The body 122 is typically constructed as a single, continuous piece. The body can be constructed of substantially any material that can be shaped and provide the rigidity to maintain the structural shape including plastic, glass, silicon, ceramic, aluminum, titanium, carbon, carbon steel, steel alloy and substantially any other material. Typically, the body is further constructed of nonconducting material. Alternatively, portions of the mounting apparatus 120 can be constructed of nonconductive material or coated with a nonconductive material.

The body 122 includes an interface wall 124. Protruding from and secured with the interface wall are one or more component mounts 126a–b. The component mounts extend out from the interface wall in a first direction. The first direction is preferably at substantially a right angle to the interface wall 124. Each component mount 126 is constructed to receive and secure a component 130a–b, typically an optical component.

In the embodiment depicted in FIG. 1, the mounting apparatus 120 includes two component mounts 126a–b. However, the apparatus can be configured to include any number of component mounts for receiving and securing one or more components. As an example, a first component mount 126a can be constructed to receive and secure a light emitting device 130a, such as a light emitting diode (LED), and a second component mount 126b can be constructed to receive and secure an optical or light sensor 130b. The component mount(s) 126 can be constructed to house substantially any optical component desired. In one embodiment, the component mounts 126 extend sufficiently far from the interface wall 124 such that when components 130 are secured with the component mounts 126, the components 130 extend out over and beyond and edge 129 of the device 128 (see FIG. 2).

The component mounts 126 include at least one means for securing or maintaining 132 the positioning of the component 130 at least partially within the component mount 126. The means for securing 132 can be achieved through any one or a combination of securing means including, but not limited to, force or pressure fit, fasteners, snaps, clips, springs, hinged rods, tongue and groove fittings, and substantially any other means for securing.

For example, referring to FIGS. 1 and 3, where FIG. 3 depicts a side view of the mounting apparatus 120 shown in FIG. 1, the first component mount 126a can be constructed to receive an LED 130a. Further, the first component mount 126a can be formed with dimensions similar to the dimensions of the LED 130a. The LED 130a shown has a cylindrical shape. Similarly, the first component mount 126a can be constructed to have a cylindrical shape. In one embodiment, the means for securing the component 132a of the first component mount 126a is a clamping, pressure or squeeze fit. As such, the first component mount 126a is constructed such that the component mount has a tapered cylindrical shape. The tapered shape is configured so that the inner diameter 140 of the first component mount 126a decreases along the length 138 of the component mount as the first component mount extends away from the interface wall 124. The inner diameter 140a of the first component mount 126a at the interface wall is greater than an LED outer diameter 142, and the tapering is such that the component mount inner diameter 140b at an outer end 146 is less than the LED outer diameter 142. The tapering of the component mount 126a additionally allows one of a variety of different sized LEDs to be inserted within the component mount 126a and to be secured in position.

Additionally, the first component mount 126a can include a slit or gap 144 that extends from the component mount outer end 146 along a portion of the length 138 of the first component mount 126a. The gap 144 allows the first component mount 126a to flex at the outer end 146 expanding the outer diameter 140b as the LED 130a is inserted within the first component mount (see FIG. 3). The flexing creates a squeezing force on the LED 130a providing the pressure fit and securing the LED within the first component mount 126a. Typically, the gap 144 is formed in the first component mount 126a at a position such that light emitted by the LED 130a escaping through the gap 144 is directed generally away from other components mounted in the mounting apparatus, such as the sensor 130b, to avoid interfering with the other components' operation.

As another example, referring to FIGS. 1 and 4, where FIG. 4 depicts a side view of the mounting apparatus 120 shown in FIG. 1, the second component mount 126b can be constructed to receive a light sensor 130b. Further, the second component mount 126b can be formed with dimensions similar to the dimensions of the sensor 130b. For example, the sensor 130b shown has a generally cubic shape. Similarly, the first component mount 126a is configured with generally a cubic shape. In one embodiment, the means for securing the component 132b of the second component mount 126b is through one or more fasteners, 136, which for example may comprise snaps, clips or the like. FIG. 5 shows a side view of a fastener 136 according to one embodiment of the present invention.

Referring to FIGS. 1, 4 and 5, the second component mount 126b can include at least one, and typically two or more component fasteners 136. In the embodiment depicted in FIGS. 1 and 4, the component fasteners are formed in the sides 148 of the second component mount 126b; however, the component fasteners 136 can be formed in the top, bottom and/or sides of the component mount 126. The sides 148 of the second component mount 126b include generally "U" shaped apertures 150 where the tongue defined within the "U" aperture forms the component fastener 136. The fastener 136 includes a ledge 152 (see FIG. 5) that extends into the second component mount 126b. When the sensor 130b is inserted into the second component mount 126b, the component fastener 136 flexes or bends out away from the sensor until the sensor is inserted beyond the ledge 152. At which point the component fastener unflexes and the ledge 152 maintains the sensor 130b position within the second component mount 126b.

In one embodiment, the interface wall 124 includes a component fastener aperture 154. The component fastener aperture 154 is formed within the mount body 122 such that at least part of the fastener aperture 154 corresponds with the "U" shaped aperture 150 of the second component mount 126b. The component fastener aperture 154 provides space for the component fastener 136 to flex out away from the sensor 130b as the sensor is inserted into the second component mount 126b. Typically, the component fastener aperture 154 is further constructed to be of sufficient area to allow the fastener 136 to be gripped, allowing the fastener to be pulled and flexed away from the sensor 126b such that the sensor can be easily removed.

FIG. 6 shows the apparatus 120 with a first component 130a (e.g., an LED) and a second component 130b (e.g., sensor) mounted and secured within the first and second component mounts 126a–b, respectively. In one embodiment, the first component mount 126a is configured to have an extended portion 156. As is shown in FIG. 6, the first component mount 126a is constructed such that the LED 130a does not extent to the outer end 146 of the first component mount resulting in the extended portion 156. Typically a length 138 of the first component mount is greater than a length 139 of the first optical component 130a (see FIGS. 1 and 3); however, this is not a requirement. The extended portion 156 provides additional directional control of emitted light from the LED 130a to aid in channeling the emitted light. Additionally, the extended portion 156 provides shielding of the emitted light and limits light from straying and interfering with the sensor 130b or other optical components on or off the circuit board 128 (see FIG. 2). In one embodiment, the second component mount 126b also includes an extended region 161 that provides additional shielding for the sensor 130b from other ambient light adversely affecting the operation of the sensor. In one embodiment, the second component mount 126b has a length 160 extending out from the interface wall 124 that is greater than a thickness 162 (see FIG. 1) of the sensor 130b.

Referring to FIGS. 1 and 3, in one embodiment, the mounting apparatus 120 includes a means for securing 180 the mounting apparatus 120 into a position for use. For example, the means for securing 180 secures the mounting apparatus to a circuit board. The means for securing 180 can be substantially any device for securing including epoxy, solder, fastener, rivet, bolt, snaps, tongue and groove, rod(s) and mating aperture(s), magnetic force, clip(s), and substantially any other means for securing. For example, the mounting apparatus includes one or more apparatus fasteners 182 similar to the component fasteners 136 as described above. Typically, a portion 185 of the apparatus fastener 182 extends beyond a base 184 of the mounting apparatus 120. The extended portion 185 allows the apparatus fastener 182 to be inserted within a receiving aperture 190 (see FIG. 2) of the device 128 with which the apparatus 120 is being mounted, such as a circuit board, a chassis, a housing for a component (such as a computer, computer terminal, a phone, a PDA, security system, and substantially any other component utilizing optical communication), and substantially an other device utilizing the mounting apparatus to mount components 130. For example, the mounting apparatus 120 can be configured to mount optical components to allow optical communication to and from a chassis mounted circuit board, to and through a front panel of a designed satellite receiver.

The extended portion 185 of the apparatus fastener 182 extending beyond the base 184 includes a ledge 186, formed by tapering the thickness of the apparatus fastener. When inserted into a receiving aperture 190, the apparatus fastener flexes until the ledge 186 passes a mating ledge or surface of the receiving aperture 190 (see FIG. 2) of the device 128 to which the mounting apparatus 120 is being mounted. Once passed the mating surface, the apparatus fastener 182 unflexes and the ledge 186 maintains the positioning of the mounting apparatus 120.

FIG. 7 shows an elevated backside view of a schematic diagram of the mounting apparatus 120. In one embodiment, the mounting apparatus 120 includes one or more protective extrusion features or means 210 for locating, guiding and securing component leads. In the embodiment depicted in FIG. 7, the protective extrusion features are two sets of lead alignment guides 210. The alignment guides 210 typically include a plurality of prongs 212 extending from the interface wall 124. The alignment guides 210 extend out from the interface wall in a second direction, substantially opposite from the direction in which the component mounts extent (i.e., the first direction). The second direction is preferably at substantially a right angle to the interface wall 124. The prongs 212 are spaced sufficiently apart to define grooves 213 between the prongs 212 to receive a lead 214 of an optical component, for example leads from the LED 130a, to be positioned in the grooves between the prongs. A groove 213 receives the lead and maintains the lead positioning.

The prongs 212 aid in protecting the leads from damage (e.g., bending and breaking) and help prevent inadvertent cross coupling between leads due to bending. The alignment guides 210 further provide alignment of the component leads with leads of the circuit board. Providing alignment of the component leads simplifies the incorporation of the mounting apparatus 120 with the circuit board 128 (see FIG. 2). This allows for enhanced communicational coupling with the leads of the circuit board. The alignment of the component leads with the leads of the circuit board provided by the alignment guides further allow for easier assembly and soldering or other electrical coupling of the leads with the circuit board to allow electrical signals to pass between the optical components and the circuit board.

In one embodiment, the prongs 212 are tapered, being thinner further way from the interface wall 124 and thicker at the interface wall. The tapering allows easier insertion of the leads 214 between the guides and further aids in securing the leads between the prongs by allowing the leads to be pressed and force fitted between the prongs 212 providing a pressure, friction force on the leads 214. The guides 210 secure the leads 214 into position for alignment with the circuit board. Maintaining the alignment simplifies assembly with the circuit board and further provides enhanced stability to the electrical connection between the components 130 and the circuit board 128.

Still referring to FIG. 7, in one embodiment, the mounting apparatus 120 includes a base 184 that rests on the mounted device 128, e.g., a circuit board, when the mounting apparatus is mounted with the device. The base 184 provides additional stability to the mounting apparatus 120 further insuring accurate alignment and positioning of the optical components 130.

In one embodiment, the mounting apparatus 120 is constructed in a generally cubic configuration such that the mounting apparatus 120 includes a base 184, a top 222, two side walls 224a–b and the interface wall 124. The mounting apparatus 120 is constructed to be open opposite the interface wall. This allows the optical components 130 to be easily incorporated and removed from the mounting apparatus 120. The base 184 and side walls 224a–b extend from the interface wall 124. In one embodiment, the base 184 does not extend the length 228 of the side walls 224. This allows the leads 214 of the components to extend down past the base to ensure contact with the device 128 allowing coupling with the device. However, the base 184 can extent the length of the sidewalls and include apertures for the leads to extend through. The component mounts 126a–b are fixed to the interface wall 124 at a predefined distance from the base to ensure a predefined height alignment. For example, referring to FIGS. 3 and 4, the first component mount is fixed with the interface wall such that a first component axis 177 is a distance $D_1$ from the base 184, and the second component mount is fixed with the interface wall such that a second component axis 179 is a distance $D_2$ from the base 184.

In one embodiment, the apparatus fasteners 182 for mounting the mounting apparatus 120 are formed as part of the sidewalls 224a–b and extending down past the base 184. The side walls 224a–b can include fastener grooves 230 separated by the width of the apparatus fastener 182 thus providing additional flexibility to the apparatus fasteners 182.

In one embodiment, the mounting apparatus 120 is formed of a single continuous piece. For example, the mounting apparatus 120 can be formed as a single piece through a plastic injection molding process.

In one embodiment, the component leads 214 are manipulated or bent to optimally interact with the mounting apparatus 120 and the device 128 with which they are mounted, e.g., a circuit board. FIGS. 8 and 9 depict a first optical component 130a and a second optical component 130b, respectively. The leads 214 are bent to precisely align with leads of the circuit board. The leads are further bent to further avoid inadvertent cross coupling between leads due to accidental bends. The alignment guides 210 (see FIG. 7) are configured to receive the bent leads 214 to maintain positioning of the leads and aid in preventing damage to the leads 214.

For example, referring to FIG. 8 depicting a first optical 130a component and leads 214, two outside leads 214a and 214c of an LED 130a are initially bent way from each other and a center lead 214b to provide accurate spacing for alignment with leads on a circuit board. The leads 214a–c are then all bent at 90 degrees such that the leads can be inserted between the alignment guides 210.

FIG. 9 shows a second optical component 130b, for example, an optical sensor. The outer leads 214d and 214f are initially bent away from each other and away from a center lead 214e. All three leads 214d–f are then bent at 90 degrees to allow the component 130b to be inserted within the component mount 126b and have the leads 214d–f extend out from the component mount. The leads 214d–f are again bent at 90 degrees to be inserted with the alignment guide 210. The leads 214 are easily bent into desired configurations to optimize stability and coupling. For example, the leads can be easily bent through machine bending and modifying.

The mounting apparatus 120 simplifies assembly of circuit boards and/or optical communication interfaces. Because the optical components 130 are easily secured within the mounting apparatus 120, the optical components are simply mounted to the circuit board through the mounting apparatus 120. Further, because the optical components 130 are precisely position within the mounting apparatus 120, the leads 214 of the optical component precisely align with leads on the circuit board. This allows easier and simplified electrical coupling (for example, through soldering) with the circuit board. Still further, assembly can be accomplished through machines because of the precise alignment provided by the mounting apparatus 120.

Further, the mounting apparatus is easily produces, for example through plastic injection molding. This reduces the cost for utilizing and mounting optical components, for example it reduces machining costs seen with previous optical component mounts. Still further, the present mounting apparatus 120 avoids the need for using light pipes or additional circuitry (e.g., additional circuit board) to deliver the optical signals on and off the circuit boards, thus reducing costs for components and assembly costs.

Because of the design of the mounting apparatus 120, both a light emitting device for transmitting optical communication and a light receiving device for receiving optical communication can be incorporated into a single fixture. The present mounting apparatus avoids the costs associated by mounting each component individually because a plurality of components can be mounting through a single mounting apparatus 120. In one embodiment, the optical components 130 mounted within the apparatus 120 are positioned to extend out away from the interface wall 124 and thus can extend out over and off an edge or boundary 129 of the device 128 (see FIGS. 2 and 4) to allow simplified interaction with other optical components of other circuit boards or other devices.

The mounting apparatus 120 can be used for substantially any component or plurality of components where it is beneficial, or needed, to mount the component or plurality of components out away from the circuit board to which they mount. For example, it may be beneficial to move optical components out off the board to move light emitted or received out away from the board simplifying and enhancing optical coupling with other components attempting to communicate with the circuit board. The mounting apparatus can also be used as an alternative in substantially any application where light piping or auxiliary circuit boards are used for moving optical coupling out off a circuit board.

While the invention herein disclosed has been described by means of specific embodiments and applications thereof, numerous modifications and variations could be made thereto by those skilled in the art without departing from the scope of the invention set forth in the claims.

What is claimed is:

1. An apparatus for mounting a component onto a circuit board, comprising:
a mount body having an interface wall;
a first component mount fixed with the interface wall, wherein the first component mount extends out from the interface wall, and wherein the first component mount is configured to receive and secure a first optical component such that at least a portion of the first optical component extends out from the interface wall;
the first component mount includes an extended portion wherein the first component mount has a length greater than a length of the first optical component, and wherein the first component mount directs light transmitted from the first optical component; and
a second component mount fixed with the interface wall, wherein the second component mount extends out from the interface wall, and wherein the second component mount is configured to receive and secure a second optical component such that at least a portion of the second optical component extends out from the interface wall.

2. The apparatus as claimed in claim 1, wherein:
the mount body includes an apparatus fastener, wherein the apparatus fastener is configured to secure the apparatus with the circuit board such that the first and second components are mounted onto the circuit and electrically coupled with the circuit board.

3. The apparatus as claimed in claim 2, wherein:
the first component mount is configured to receive and secure the first optical component such that at least a portion of the first optical component extends off a boundary of the circuit board to which the apparatus mounts; and
the second component mount is configured to receive and secure the second optical component such that at least a portion of the second optical component extends off the boundary of the circuit board to which the apparatus mounts.

4. The apparatus as claimed in claim 2, wherein:
the first component mount includes a first means for securing a component with the first component mount; and
the second component mount includes a second means for securing a component with the second component mount.

5. The apparatus as claimed in claim 4, wherein:
the first component mount receives and secures a light emitting component; and
the second component mount receives and secures a light sensing component.

6. The apparatus as claimed in claim 4, wherein:
the second means for securing the second component includes a component fastener.

7. The apparatus as claimed in claim 1, wherein:
the first component mount having a pressure fit, wherein the pressure fit is configured to secure the first component with the first component mount; and
the second component mount having a component fastener, wherein the component fastener is configured to secure the second component with the second component mount.

8. The apparatus as claimed in claim 1, further comprising:
a first alignment guide fixed with the mount body and a second alignment guide fixed with the mount body, wherein the first alignment guide receives a first lead of the first component, secures the first lead and aligns the first lead for coupling with the circuit board, and the second alignment guide receives a second lead of the second component, secures the second lead and aligns the second lead for coupling with the circuit board.

9. The apparatus as claimed in claim 8, wherein:
the first alignment guide receives a plurality of first leads of the first component, secures each of the plurality of first leads and aligns the plurality of first leads for electrical coupling with the circuit board, and the second alignment guide receives a plurality of second leads of the second component, secures each of the plurality of second leads and aligns the plurality of second leads for electrical coupling with the circuit board.

10. The apparatus as claimed in claim 8, wherein
the first alignment guide includes a plurality of prongs spaced to define one or more grooves between the plurality of prongs, wherein at least one of the one or more grooves of the first alignment guide receives and secures the first lead of the first component; and
the second alignment guide includes a plurality of prongs spaced to define one or more grooves between the plurality of prongs, wherein at least one of the one or more grooves of the second alignment guide receives and secures the second lead of the second component.

11. The apparatus as claimed in claim 1, wherein: the apparatus is constructed as a single continuous piece.

12. An apparatus for mounting components, comprising:
a mount body;
a first means for mounting a first component with the mount body such that at least a portion of the first component extends out from the mount body;
a second means for mounting a second component with the mount body such that at least a portion of the second component extends out from the mount body; and
the second means for mounting includes an extended region wherein the second means for mounting has a length greater than a thickness of the second component, and wherein the second means for mounting shields the second component from light emitted from the first component.

13. The apparatus as claimed in claim 12, further comprising:
a first means for guiding one or more leads of the first component, wherein the first means for guiding includes at least one means for securing the one or more leads of the first component, and a second means for guiding one or more leads of the second component, wherein the second means for guiding includes at least one means for securing the one or more leads of the second component, wherein the first and second means for guiding are fixed with the mount body.

14. The apparatus as claimed in claim 13, wherein:
the first means for mounting the first component having a length greater than a length of the first component such that the first means for mounting channels transmitted light from the first component.

15. A method for mounting optical communication components to a circuit board, comprising the steps of:

securing first and second component mounts with a mount body in positions relative with each other;

securing a first optical component within the first component mount;

securing a second optical component within the second component mount;

securing the mount body with the circuit board and providing positioning of the first and second optical components at a predefined distance above the circuit board to provide optical communication onto and off of the circuit board;

channeling transmitted light from the first optical components; and shielding the second optical component from external light.

16. The method of claim 15, wherein the securing the second optical component within the second component mount includes securing the second optical component with a fastener.

17. The apparatus of claim 1, wherein the second component mount includes an extended region such that the second component mount has a length greater than a thickness of the second optical component, wherein the second component mount shields the second optical component from external light.

18. The apparatus of claim 12, further comprising:

the first component mount includes an extended portion such that the first component mount has a length greater than a length of the first optical component, wherein the first component mount directs light transmitted from the first optical component.

19. The apparatus of claim 12, wherein the second optical component is an optical signal detector.

20. The method as claimed in claim 16, further comprising the steps of:

securing and aligning a first lead of the first optical component, such that the first lead is aligned with a second lead of the circuit board; and securing and aligning a third lead of the second optical component, such that the third lead is aligned with a fourth lead of the circuit board.

* * * * *